United States Patent [19]

Kawai et al.

[11] Patent Number: 5,365,141
[45] Date of Patent: Nov. 15, 1994

[54] PIEZOELECTRIC TRANSFORMER AND METHOD FOR DRIVING THE SAME

[75] Inventors: Jun Kawai; Satoru Tagami, both of Tokyo, Japan

[73] Assignee: NEC Corporation, Tokyo, Japan

[21] Appl. No.: 18,290

[22] Filed: Feb. 16, 1993

[51] Int. Cl.$^5$ ............................................. H01L 41/08
[52] U.S. Cl. .................................... 310/359; 310/316; 310/366
[58] Field of Search ............... 310/316, 317, 319, 359, 310/366

[56] References Cited

U.S. PATENT DOCUMENTS

| | | | |
|---|---|---|---|
| 2,974,296 | 3/1961 | Rosen | 310/359 |
| 3,562,792 | 2/1971 | Berlincourt et al. | 310/359 X |
| 3,707,636 | 12/1972 | Inoue | 310/359 X |
| 3,736,446 | 5/1973 | Berlincourt et al. | 310/359 X |
| 3,764,848 | 10/1973 | Berlincourt et al. | 310/359 X |

*Primary Examiner*—Mark O. Budd
*Attorney, Agent, or Firm*—Burns, Doane, Swecker & Mathis

[57] ABSTRACT

A piezoelectric transformer is constituted of a piezoelectric plate in the form of an elongated plate and electrodes formed thereon. A pair of driver sections and a generator section are formed in two opposite end regions of the piezoelectric plate containing a mechanical resonance node and in a central region of the piezoelectric plate containing a mechanical resonance node, respectively, in an oscillation mode of three times of $\frac{1}{2}$ of the resonance wavelength $\lambda$ of the longitudinal mechanical oscillation in length of the piezoelectric plate. The driver sections are polarized in a thickness direction but in directions opposite to each other. The driver sections have a distance of $\lambda/2$ from the corresponding end of the piezoelectric plate.

8 Claims, 4 Drawing Sheets

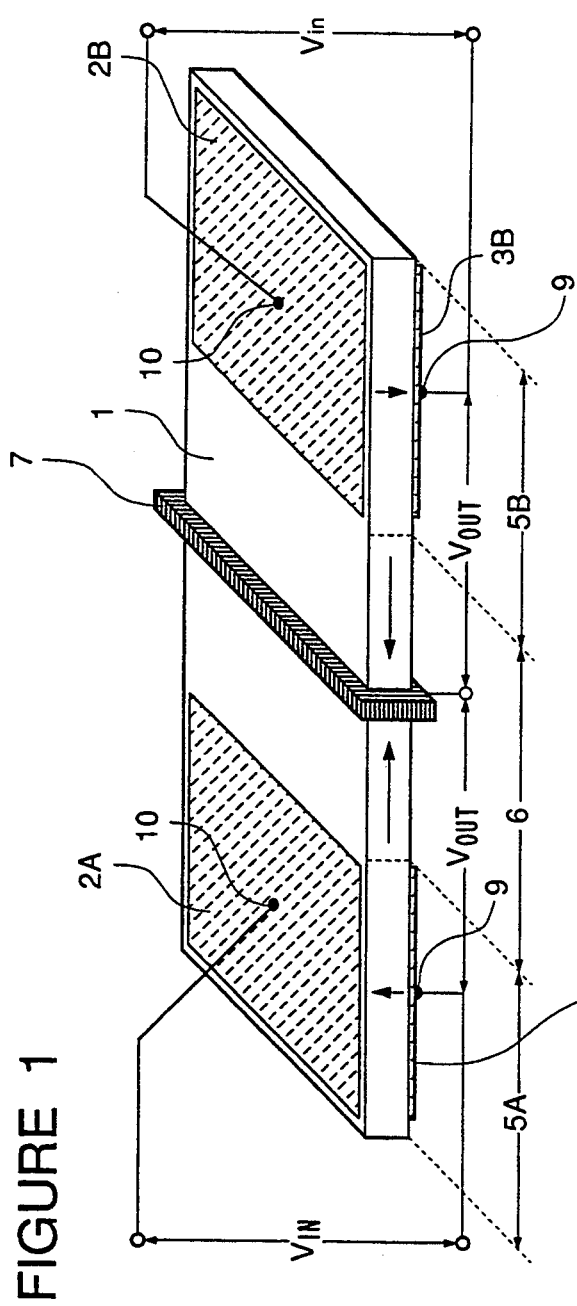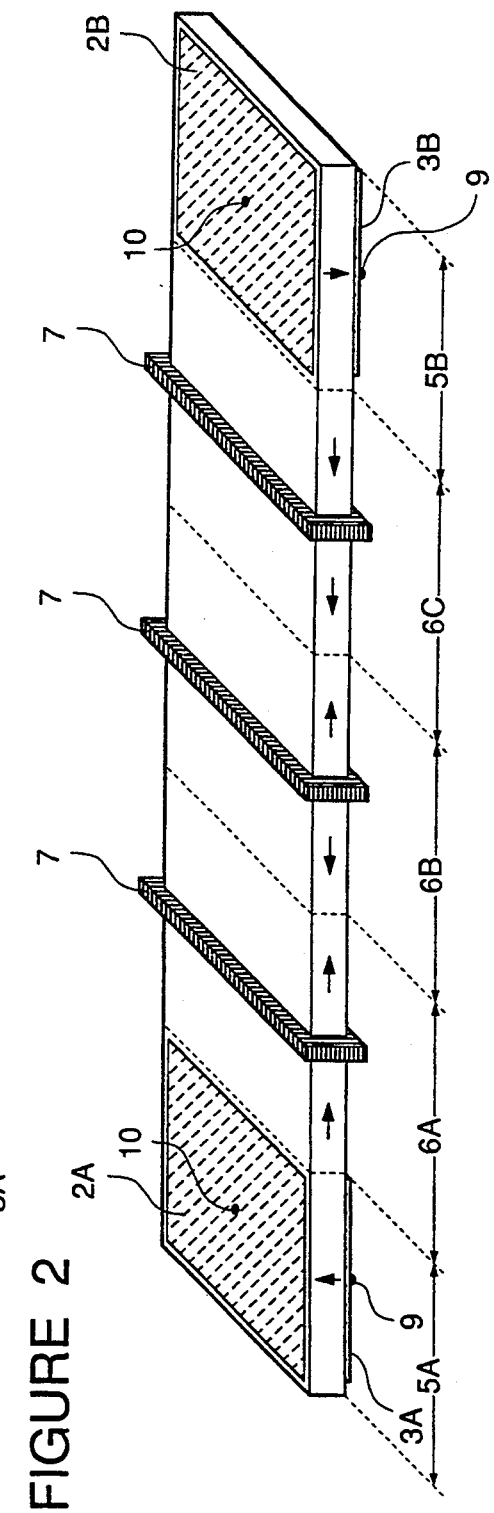

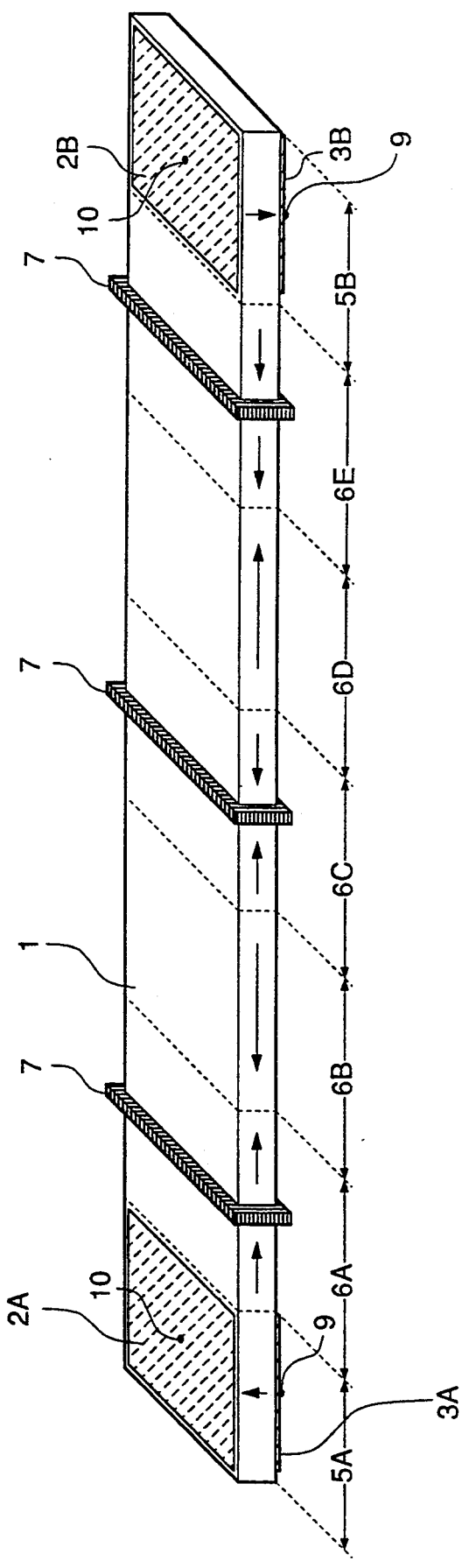
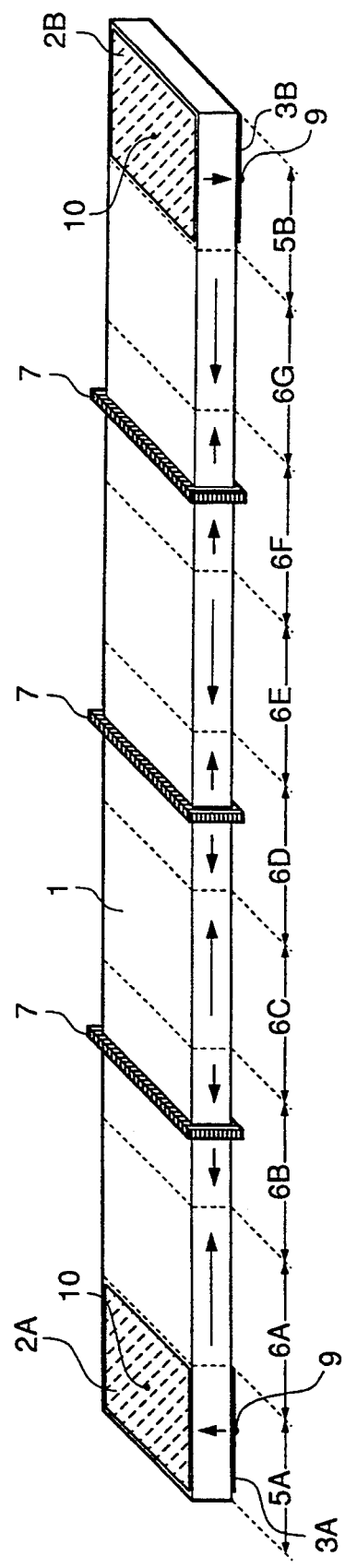
FIGURE 3
FIGURE 4

PIEZOELECTRIC TRANSFORMER AND METHOD FOR DRIVING THE SAME

BACKGROUND OF THE INVENTION

1. Field of the Invention

The present invention relates to a piezoelectric transformer used for various high voltage power supplies, and more particularly to a piezoelectric transformer for a small-sized high voltage power supply that is required to be miniaturized and to have a high reliability.

2. Description of Related Art

In most of cases, high voltage generating transformers used for a photocopiers and a backlight of crystal liquid displays have been conventionally composed of electromagnetic solenoid transformers.

On the one hand, a piezoelectric transformer having an operation principle completely different from that of the electromagnetic solenoid transformer has been proposed. A typical example of the conventional piezoelectric transformer is constituted of an elongated piezoelectric plate and a pair of driving electrodes formed on upper and lower surfaces of a half portion of the piezoelectric plate in a lengthwise direction, respectively. An input AC (alternating current) voltage is applied between the pair of driving electrodes. Therefore, a portion of the piezoelectric plate applied with the input voltage is called a "driver section". The piezoelectric plate in the "driver section " is polarized in a thickness direction. The other part of the piezoelectric plate is called a "generator section", and the piezoelectric plate in the "generator section" is polarized in a lengthwise or longitudinal direction.

An output electrode is formed on an end surface of the generator section of the piezoelectric plate, so that an output voltage is obtained between the output electrode and one of the driving electrodes. For fixing the piezoelectric transformer, a support member is positioned at a node in a lengthwise direction of a longitudinal mechanical oscillation in length.

In this condition, if an AC voltage having a resonance frequency of the longitudinal oscillation in a lengthwise direction of the piezoelectric plate is applied between the pair of driving electrodes, the piezoelectric plate resonates mechanically. As a result, the high voltage having the same frequency as that of the input voltage is outputted from the "generator part".

In the above mentioned conventional piezoelectric transformer the connection to the electrodes of the driver section and the generator section is not effected at any node of the oscillation, which lowers the reliability remarkably. In order to resolve the above mentioned disadvantages, an improved piezoelectric transformer has been proposed.

This improved piezoelectric transformer is composed of an elongated piezoelectric plate divided into a pair of driver sections and a generator section between the driver sections. Each of the driver sections includes a pair of driving electrodes formed on upper and lower surfaces of the driver section, and the generator section includes an output electrode extending on the piezoelectric plate in its transverse direction at a position equally having the generator section of the piezoelectric plate. This output electrode also functions as a support member.

The pair of "driver sections" are of the piezoelectric plate are polarized in the same thickness direction, for example in an upward direction. The two halves of the piezoelectric plate of the generator section are polarized in directions opposite to each other in a lengthwise or longitudinal direction, for example, in directions towards the output electrodes.

With this construction, an input AC voltage is applied between the pair of driving electrodes of each of the driver sections, and an output voltage is obtained between the output electrode and one of the driving electrodes of each of the driver sections.

The two above mentioned conventional piezoelectric transformers are small-sized and can generate a high voltage. Accordingly, these transformers are very attractive to an inverter used for back-lighting a liquid crystal, which is strongly required to be miniaturized. However, even the second mentioned improved piezoelectric transformers has large problems as follows:

(1) The driver sections of the two ends of the piezoelectric plate are driven in the same phase. Therefore, in the case that the piezoelectric transformer is driven using a DC power source, the change with time of a load for the power source is very large.

(2) The input voltage must be relatively large, so that the degree of freedom for selection is limited.

(3) In connection to the output voltage, the degree of freedom for the selection of the transformation ratio is also small.

(4) Since there are only a small number of the terminals and support points, the oscillation impact risks to cause a damage in a using condition.

SUMMARY OF THE INVENTION

Accordingly, it is an object of the present invention to provide a piezoelectric transformer which has overcome the above mentioned defect of the conventional one.

Another object of the present invention is to provide a piezoelectric transformer and a method for driving the same, which are capable of driving a pair of driver sections of the piezoelectric transformer in opposite phases, respectively.

A still another object of the present invention is to provide a piezoelectric transformer and a method for driving the same, which can have a reduced input voltage and a large transformation ratio.

The above and other objects of the present invention are achieved in accordance with the present invention by a piezoelectric transformer constituted of a piezoelectric plate in the form of an elongated plate and electrodes formed thereon, the piezoelectric plate being divided into a pair of driver sections and at least one generator section, the pair of driver sections being formed of two end regions of the piezoelectric plate containing a mechanical resonance node in an oscillation mode of the three or more odd number times of $\frac{1}{2}$ of a resonance wavelength $\lambda$ of the longitudinal mechanical oscillation in length of the piezoelectric plate, the at least one generator section being formed of a central region of the piezoelectric plate containing a mechanical resonance node in the above mentioned oscillation mode, the driver sections being polarized in a thickness direction, the driver sections having a distance of $\lambda/2$ from the corresponding end of the piezoelectric plate.

Preferably, least one generator section is divided into three or more odd umber of regions at every distance of $\lambda/2$, a center region of the three or more odd number of regions being also divided into two central regions at a distance of $\lambda/4$, the two central regions and three or more odd number of regions excluding the three or more odd number of regions being polarized in a longitudinal direction in such a manner that the polarization of each pair of adjacent regions is opposite to each other.

In one embodiment, the driver sections are polarized in the thickness direction but in a direction opposite to each other. In another embodiment, the driver sections being polarized in the same thickness direction. In addition, supports which also function as an electrical terminal are formed at the nodes of the mechanical resonance of the longitudinal oscillation in length of the piezoelectric plate in both of the driver sections and the at least one generator section.

As will be seen from the above, in order to resolve above mentioned problems, the present invention is characterized in that:

(1) A driver section is provided at each of the two opposite ends containing anode of a mechanical oscillation therein;

(2) The direction of the polarization of the driver sections are made to opposite to each other;

(3) Inputs having the reverse phase or the same phase are applied to the two driver sections, respectively;

(4) A generation section is provided at a central portion containing an ode of the mechanical oscillation;

(5) An oscillation mode of a high order is utilized (6) Direction of polarizations are set in such a way that a generated voltage is added one another, and;

(7) Electric terminals which also function as a support are located at oscillation nodes in the driver sections and in the generator section.

The above and other objects, features and advantages of the present invention will be apparent from the following description of preferred embodiments of the invention with reference to the accompanying drawings.

BRIEF DESCRIPTION OF THE DRAWINGS

FIG. 1 is a diagrammatic perspective view of a first embodiment of the piezoelectric transformer in accordance with the present invention, having three times $\lambda/2$ mode;

FIG. 2 is a diagrammatic perspective view of a second embodiment of the piezoelectric transformer in accordance with the present invention, having five times $\lambda/2$ mode;

FIG. 3 is a diagrammatic perspective view of a third embodiment of the piezoelectric transformer in accordance with the present invention, having seven times $\lambda/2$ mode;

FIG. 4 is a diagrammatic perspective view of a fourth embodiment of the piezoelectric transformer in accordance with the present invention, having nine times $\lambda/2$ mode;

DESCRIPTION OF THE PREFERRED EMBODIMENTS

Figure 5:
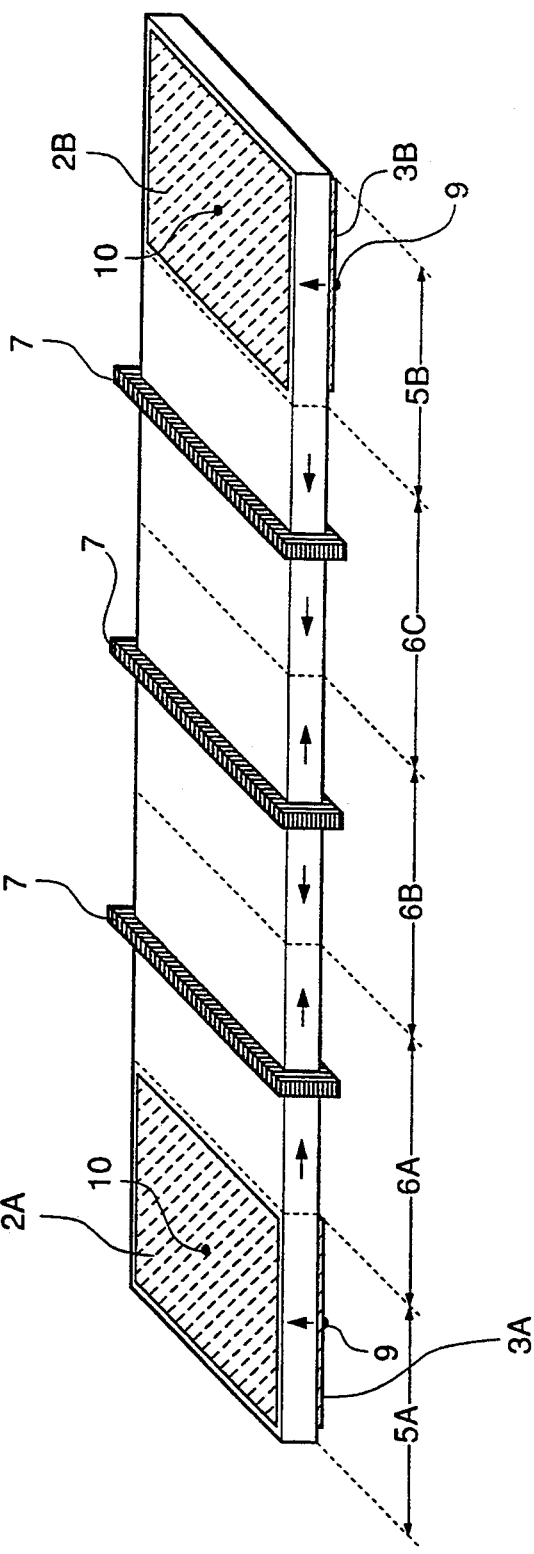
FIG. 5 is a diagrammatic perspective view of a fifth embodiment of the piezoelectric transformer in accordance with the present invention, having five times $\lambda/2$ mode.

The present invention will be described in detail in the following description of embodiments. Now, common points in the following embodiments are explained together.

(1) Material Plate for the Piezoelectric Transformer

As a piezoelectric material having a small electromechanical coupling coefficient $k_{31}$ (in a direction perpendicular to a polarization direction) and a large electromechanical coupling coefficient $k_{33}$ (in a polarization direction), a sintered material available under the tradename NEPEC 8 from Torkin (Japanese Corporation) was used. This sintered material was cut into a desired form of an elongated plate.

(2) Formation of the Electrodes

Electrodes were formed by patterning a silver-palladium paste containing 75% of silver and 25% of palladium by means of a usual thick film screen printing process and then by sintering the patterned electrodes at a temperature of 600° C.

(3) Polarization Processing

In an insulating oil heated at a temperature of 150° C., a DC electric field of 1.5K/mm is applied and maintained for 15 minutes.

(4) Installation of Supports

A support for the driver section was produced by blanking a copper plate having a thickness of 0.1 mm. A length of the support was made equal to the width of the electrodes formed on the piezoelectric transformer material plate, and a width of the support was made 0.3 mm. This blanked copper plate was electrically soldered at a position of a lower surface of the piezoelectric transformer material plate corresponding to an oscillation node.

A support for the generator section was produced by blanking a copper plate having a thickness of 0.1 mm to form a hole slightly larger than a transverse sectional form of the piezoelectric transformer material plate. This blanked copper plate was used as a support. The piezoelectric transformer material plate was inserted into the hole of the blanked copper plate support, and the blanked copper plate support was electrically soldered and fixed to the silver-palladium electrode deposited on at a point corresponding to an oscillation node in a longitudinal direction.

(5) Installation of Terminals

A terminal formed by blanking a copper plate having a thickness of 0.1 mm, so as to have a size of 0.3 mm × 0.3 mm square, was fixed, by a spot-soldering, to a center of the upper surface of the driver section which corresponds to the oscillation node.

Embodiment 1

Referring to FIG. 1, there is shown a diagrammatic perspective view of a first embodiment of the piezoelectric transformer in accordance with the present invention, having three times $\lambda/2$ mode.

A three times $\lambda/2$ mode piezoelectric transformer as shown in FIG. 1 was manufactured. In FIG. 1, the piezoelectric transformer is constituted of a piezoelectric plate 1 which is divided into a pair of driver sections (or input section) 5A and 5B and one generation section (or output section) 6 between the driver sections 5A and 5B. The piezoelectric transformer comprises a pair of electrodes 2A and 3A and 2B and 3B formed on an upper surface and a lower surface of each of the driver sections 5A and 5B, respectively. A terminal and support 7 is electrically soldered on an output electrode formed on the generator section 6 at the center position in a longitudinal direction. The piezoelectric transformer also comprises lower and upper electrode terminals 9 and 10 which are formed on the electrodes 2A and 3A and 2B and 3B of each of the driver sections 5A and 5B, respectively and which are positioned at a center position in a longitudinal direction of the driver sections 5A and 5B. In this figure, arrows depicted at a longitudinal front side surface of the piezoelectric plate 1 show a polarization direction. As shown by the arrows, the two generator sections 5A and 5B were polarized in a thickness direction but in directions opposite to each other. The generator section 6 was divided by a center transverse plate into two portions in length, and the two portions were polarized in a longitudinal direction but in an opposite direction to each other.

With this arrangement, an input voltage Vin is applied between the pair of electrodes 2A and 3A of the driver section 5A and between the pair of electrodes 2B and 3B of the driver section 5B, and an output voltage Vout is obtained between the output electrode 7 and the input electrode 3A of the driver section 5A and between the output electrode 7 and the input electrode 3B of the driver section 5B.

All of the driver sections 5A and 5B formed at opposite end portions of the piezoelectric plate 1 and the generator section 6 shown in FIG. 1 have a length of $\lambda/2$ (where $\lambda$ is a wavelength of a resonance frequency), and the piezoelectric plate 1 has a total length of 72.7 mm, a width of 22.6 mm and a thickness of 1.4 mm. Therefore, the output electrode 7 and the lower and upper electrode terminals 9 and 10 are located at respective nodes of a mechanical oscillation generated in the piezoelectric plate 1.

An alternating electrical current voltage is applied between electrodes 2A and 3A of the driver section 5A and between the electrodes 2B and 3B of the driver section 5B in a phase opposite to each other. Namely, the AC input voltage applied between electrodes 2A and 3A of the driver section 5A is opposite in a phase to that applied between the electrodes 2B and 3B of the driver section 5B. On the other hand, the output voltage Vout between the output electrode 7 and the input electrode 3A of the driver section 5A and the output voltage Vout between the output electrode 7 and the input electrode 3B of the driver section 5B are combined in parallel to each other.

Then, the resonance frequency of the third order mode is 64.4 KHz. If the output impedance is 211 K$\Omega$, the output is 1300 V with the input of 48 V. Namely, the output of 8 W is obtained.

Figure 6:
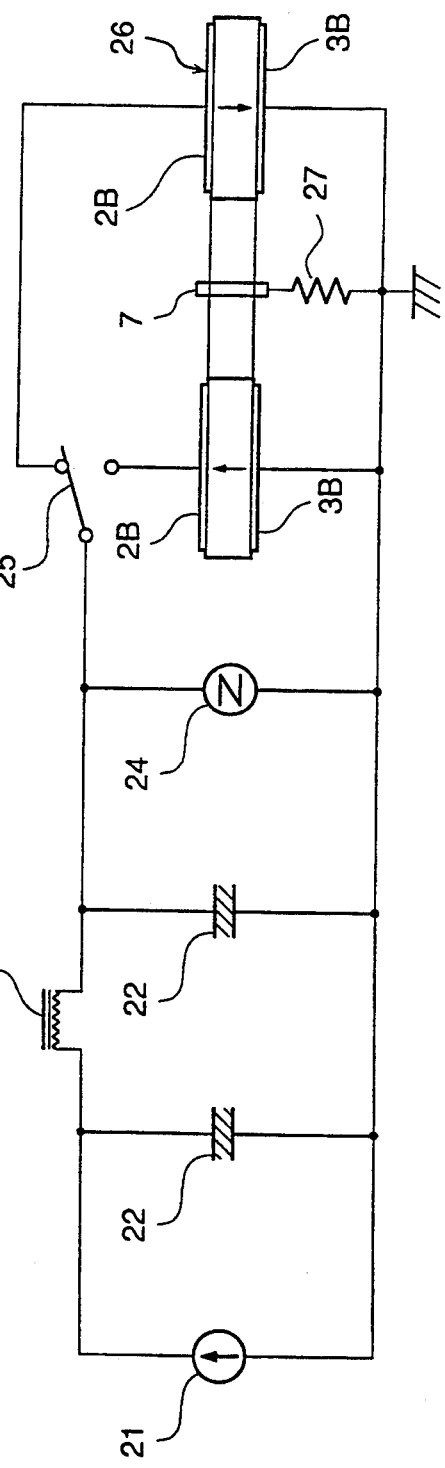
FIG. 6 shows an example of the evaluation and driving process of the piezoelectric transformer.
Figure 7:
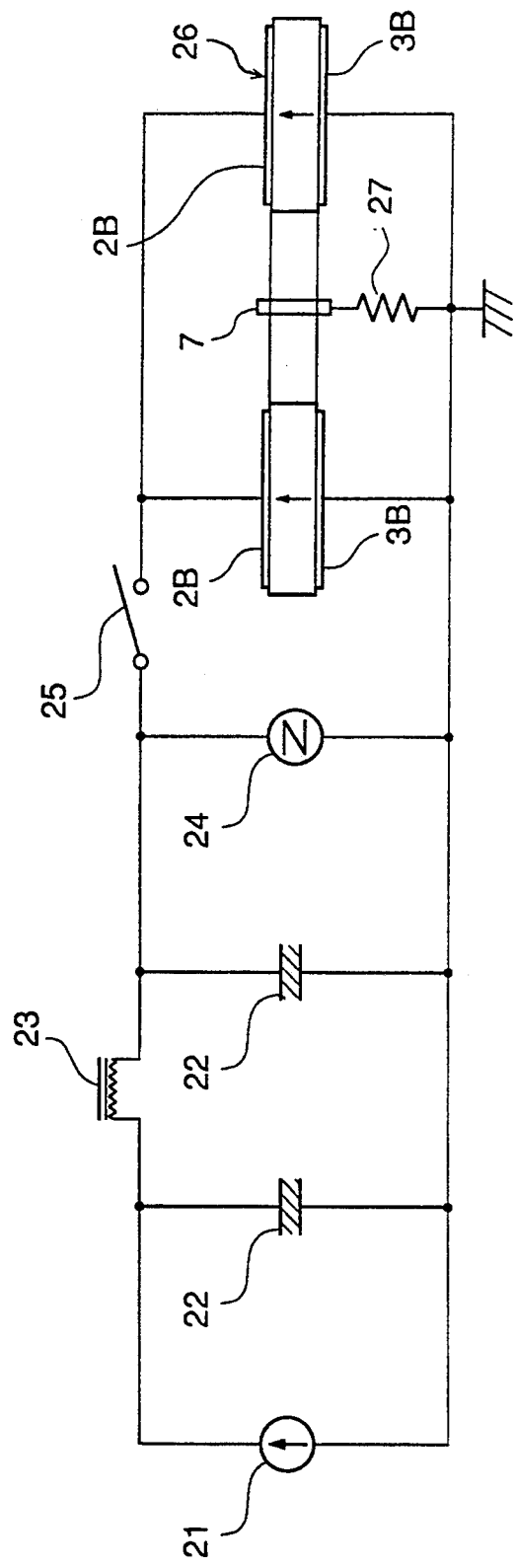
FIG. 7 shows another example of the evaluating and driving process of the piezoelectric transformer.

Further, the power source noise occurred at the time of driving the piezoelectric transformer by switching of the DC power source was measured. Namely, the piezoelectric transformer in the present embodiment was measure by a circuit structure shown in FIG. 6, while the second conventional transformer explained hereinbefore was measured by a circuit structure shown in FIG. 7. In FIGS. 6 and 7, Reference Numbers 21, 22, 23, 24, 25, 26 and 27 represents a DC power source, an smoothing electrolytic capacitor, a choke coil, a varistor for protection of the power source, an electronic switch, a piezoelectric transformer and a load resistance, respectively.

The electrical switch 25 was switched in such a way that the repeated pulse frequency become their resonance frequency and that the duty becomes 50%. In addition, a voltage of the DC power source 21 was adjusted so that a consumed electric power are equal in the two driver sections shown in FIGS. 6 and 7.

In the circuit shown in FIG. 6, the electrical fields in a phase shifted from each other by 180° were applied to the two driver sections 5A and 5B, respectively. In the circuit shown in FIG. 7, the electrical fields having the same phase were applied to the two driver sections at the same time.

As a result, it was recognized that the outputs of the piezoelectric transformers shown in FIGS. 6 and 7 are almost same. On the other hand, the output variance of the DC power source 1 was measured. Thus, it was observed that the variance is reduced by more than one digit in the present embodiment shown in FIG. 6 in comparison with the conventional example shown in FIG. 7.

As a reliability test of the piezoelectric transformer in accordance with this embodiment, the continuous operation test was effected for 20,000 hours in the atmosphere of the relative humidity of 85% at a temperature of 80° C. As a result, not eve one sample showed an abnormality of the characteristics among 250 samples.

Embodiment 2

A five times $\lambda/2$ mode piezoelectric transformer as shown in FIG. 2 was manufactured. In FIG. 2, elements corresponding or similar to those shown in FIG. 1 are given the same Reference Numbers and explanation thereof will be omitted. The second embodiment includes three generation sections 6A, 6B and 6C in place of the single generation section 6 of Embodiment 1.

In FIG. 2, each of arrows depicted at a longitudinal front side surface of the piezoelectric plate 1 shows a polarization direction. As shown by the arrows, the two generator sections 5A and 5B were polarized in a thickness direction but in directions opposite to each other.

A portion of the piezoelectric plate 1 between the generator sections 5A and 5B is divided into two center sections of a distance $\lambda/4$ from a longitudinal center section plane, and two outside sections 6A and 6C of a distance $\lambda/2$ adjacent to the center sections. These four sections are polarized in a longitudinal direction in such a manner that the polarizations of each pair of adjacent sections are opposite to each other. The two center sections of a distance $\lambda/4$ form one generation section 6B. Each of the three generator sections 6A, 6B and 6C has an output electrode and support 7 which is positioned at a center position in the longitudinal direction and which is formed similar to the output electrode and support 7 of Embodiment 1.

Each of the driver sections 5A and 5B has a length of $\lambda/2$ and the generator sections 6A, 6B and 6C have a length of and 1.5 $\lambda$ as a whole.

The piezoelectric transformer has a total length of 121.2 mm, a width of 22.6 mm and a thickness of 1.4 mm.

An AC voltage is applied between electrodes 2A and 3A of the driver section 5A and between the electrodes 2B and 3B of the driver section 5B in a phase opposite to each other. Namely, the AC input voltage applied between electrodes 2A and 3A of the driver section 5A is opposite in a phase to that applied between the electrodes 2B and 3B of the driver section 5B. On the other hand, the output voltage Vout is obtained by connecting the three output electrodes 7, the input electrode 3A of the driver section 5A and the input electrode 3B of the driver section 5B into parallel.

In this embodiment, the resonance frequency of the fifth order mode is 64.4 KHz. If the output impedance is 211 KΩ, the output is 1300 V with the input of 16 V. Namely, the output of 8 W is obtained.

As a reliability test of the piezoelectric transformer in accordance with this second embodiment, the continuous operating test was effected for 20,000 hours in the atmosphere of the relative humidity of 85% at a temperature of 80° C. As a result, not even one sample showed an abnormality of the performance among 200 samples.

Embodiment 3

A seven times λ/2 mode piezoelectric transformer as shown in FIG. 3 was manufactured. In FIG. 3, elements corresponding or similar to those shown in FIG. 1 are given the same Reference Numbers and explanation thereof will be omitted. The second embodiment includes five generation sections 6A, 6B, 6C, 6D and 6E in place of the single generation section 6 of Embodiment 1.

In FIG. 3, each of arrows depicted at a longitudinal front side surface of the piezoelectric plate 1 shows a polarization direction. As shown by the arrows, the two generator sections 5A and 5B were polarized in a thickness direction but in directions opposite to each other.

A portion of the piezoelectric plate 1 between the generator sections 5A and 5B is divided into two center sections of a distance λ/4 from a longitudinal center section plane, two middle sections 6B and 6D of a distance λ/2 adjacent to the center sections, and two outside sections 6A and 6E of a distance λ/2 outward adjacent to the middle sections 6B and 6D, respectively. These six sections are polarized in a longitudinal direction in such a manner that the polarizations of each pair of adjacent sections are opposite to each other. The two center sections of a distance λ/4 form one generation section 6C. Each of the generator sections 6A, 6C and 6E has an output electrode and support 7 which is positioned at a center position in the longitudinal direction and which is formed similar to the output electrode and support 7 of Embodiment 1.

Each of the driver sections 5A and 5B has a length of λ/2 and the generator sections 6A, 6B, 6C, 6D and 6E have a length of and 2.5 λ as a whole. The piezoelectric transformer has a total length of 169.6 mm, a width of 22.6 mm and a thickness of 1.4 mm.

An AC voltage is applied between electrodes 2A and 3A of the driver section 5A and between the electrodes 2B and 3B of the driver section 5B in a phase opposite to each other. Namely, the AC input voltage applied between electrodes 2A and 3A of the driver section 5A is opposite in a phase to that applied between the electrodes 2B and 3B of the driver section 5B. On the other hand, the output voltage Vout is obtained by connecting the three output electrodes 7, the input electrode 3A of the driver section 5A and the input electrode 3B of the driver section 5B into parallel.

In this embodiment, the resonance frequency of the seventh order mode is 64.4 KHz. If the output impedance is 211 KΩ, the output is 1300 V with respect to the input of 9.6 V. Namely, the output of 8 W is obtained.

As a reliability test of the piezoelectric transformer in accordance with this embodiment, the continuous operating test was effected for 20,000 hours in the atmosphere of the relative humidity of 85% at a temperature of 80° C. As the result, not even one sample showed an abnormality of the performance among 200 samples.

The bases of the terminals 9 and 7 of the piezoelectric transformer in accordance with the present embodiment were mounted by soldering on a standard printed wiring board. The impact test was effected in three directions of length, width and thickness. As a result, it was clearly observed that the transformers can resist the impact to 500 G.

Embodiment 4

A nine times λ/2 mode piezoelectric transformer as shown in FIG. 4 was manufactured. In FIG. 4, elements corresponding or similar to those shown in FIG. 1 are given the same Reference Numbers and explanation thereof will be omitted. The second embodiment includes seven generation sections 6A, 6B, 6C, 6D, 6E, 6F and 6G in place of the single generation section 6 of Embodiment 1.

In FIG. 4, each of arrows depicted at a longitudinal front side surface of the piezoelectric plate 1 shows a polarization direction. As shown by the arrows, the two generator sections 5A and 5B were polarized in a thickness direction but in directions opposite to each other.

A portion of the piezoelectric plate 1 between the generator sections 5A and 5B is divided into two center sections of a distance λ/4 from a longitudinal center section plane, to middle sections 6C and 6E of a distance λ/2 adjacent to the center sections, two middle sections 6B and 6F of a distance λ/2 outward adjacent to the middle sections 6C and 6E, and two outside sections 6A and 6G of a distance λ/2 outward adjacent to the middle sections 6B and 6F, respectively. These eight sections are polarized in a longitudinal direction in such a manner that the polarizations of each pair of adjacent section are opposite to each other. The two center sections of a distance λ/4 form on generation section 6D. Each of the generator sections 6B, 6D and 6F has an output electrode and support 7 which is positioned at a center position in the longitudinal direction and which is formed similar to the output electrode and support 7 of Embodiment 1.

Each of the driver sections 5A and 5B has a length of λ/2 and the generator sections 6A, 6B, 6C, 6D, 6E, 6F and 6G have a length of and 3.5 λ as a whole. The piezoelectric transformer has a total length of 218.1 mm, a width of 22.6 mm and a thickness of 1.4 mm.

An AC voltage is applied between electrodes 2A and 3A of the driver section 5A and between the electrodes 2B and 3B of the driver section 5B in a phase opposite to each other. Namely, the AC input voltage applied between electrodes 2A and 3A of the driver section 5A is opposite in a phase to that applied between the electrodes 2B and 3B of the driver section 5B. On the other hand, the output voltage Vout is obtained by connecting the three output electrodes 7, the input electrode 3A of the driver section 5A and the input electrode 3B of the driver section 5B into parallel.

In this embodiment, the resonance frequency of the ninth order mode is 64.4 KHz. If the output impedance is 211 KΩ, the output is 1300 V with the input of 6.9 V. Namely, the output of 8 W is obtained.

As a reliability test of the piezoelectric transformer in accordance with this embodiment, the continuous operating test was effected for 20,000 hours in the atmosphere of the relative humidity of 85% at a temperature of 80° C. As the result, not even one sample showed an abnormality of the performance among 100 samples.

The piezoelectric transformer in accordance with the present embodiment were mounted by soldering on a standard printed wiring board. The impact test was effected in three directions of length, width and thickness. As a result, it was clearly observed that the transformers can resist the impact to 500 G.

Embodiment 5

A five times λ/2 mode piezoelectric transformer as shown in FIG. 5 was manufactured. In FIG. 5, elements corresponding or similar to those shown in FIG. 1 are given the same Reference Numbers and explanation thereof will be omitted. The second embodiment includes three generation sections 6A, 6B and 6C in place of the single generation section 6 of Embodiment 1.

In FIG. 5, each of arrows depicted at a longitudinal front side surface of the piezoelectric plate 1 shows a polarization direction. As shown by the arrows, the two generator sections 5A and 5B were polarized in the same thickness direction.

A portion of the piezoelectric plate 1 between the generator sections 5A and 5B is divided into two center sections of a distance λ/4 from a longitudinal center section plane, and two outside sections 6A and 6C of a distance λ/2 adjacent to the center sections. These four sections are polarized in a longitudinal direction in such a manner that the polarizations of each pair of adjacent sections are opposite to each other. The two center sections of a distance λ/4 form one generation section 6B. Each of the three generator sections 6A, 6B and 6C has an output electrode and support 7 which is positioned at a center position in the longitudinal direction and which is formed similar to the output electrode and support 7 of Embodiment 1.

Each of the driver sections 5A and 5B has a length of λ/2 and the generator sections 6A, 6B and 6C have a length of and 1.5 λ as a whole. The piezoelectric transformer has a total length of 121.2 mm, a width of 22.6 mm and a thickness of 1.4 mm.

An AC voltage is applied between electrodes 2A and 3A of the driver section 5A and between the electrodes 2B and 3B of the driver section 5B in the same phase. On the other hand, the output voltage Vout is obtained by connecting the three output electrodes 7, the input electrode 3A of the driver section 5A and the input electrode 3B of the driver section 5B into parallel.

In this embodiment, the resonance frequency of the fifth order mode is 64.4 KHz. If the output impedance is 211 KΩ, the output is 1300 V with the input of 16 V. Namely, the output of 8 W is obtained.

As a reliability test of the piezoelectric transformer in accordance with this second embodiment, the continuous operating test was effected for 20,000 hours in the atmosphere of the relative humidity of 85% at a temperature of 80° C. As a result, not even one sample showed an abnormality of the performance among 150 samples.

The small-sized transformer is often integrated into a device such as a electrostatic photocopier or a backlight for a liquid crystal, and is then supplied by a DC source from a main device. In this case, the main device supplies an electric power to numerous sub-systems from the same power source. Thus, if an interference is caused by noise through a power source, it is very troublesome. A first effect of the present invention is to reduce the noise by more than one digit in comparison with the convention piezoelectric transformer.

Further, the selection range of the transformation ratio is wide without varying the resonance frequency by using the high order oscillation mode if necessary. Namely, as mentioned above, the voltage supplied form the main device is strictly limited. The present invention is very useful to eliminate this limitation. Furthermore, if the input voltage is constant, the output voltage can be increased in accordance with the order of the oscillation mode. It is also very advantageous.

In addition, it would be obvious from the embodiments that the present invention provides a voltage step-up transformer having very high reliability. It has been known that the conventional solenoid transformer always had a short-circuit failure in a high humidity at a high temperature. However, the transformers of the present invention cause no failure like short-circuit failure, as it is clear from the embodiments described above. It results form the facts that the piezoelectric transformer of the present invention has a simple structure and that the electrical connections can be effected only at necessary points among the nodes of which the number is equal to the order number of the oscillation.

Conventionally, although the piezoelectric transformers having an excellent structure have been proposed, they have not been widely used in an industrial field. It is because the electrical connection was not effected at an unstable side (side of wave) of the mechanical oscillation. The present invention improves the stability because the support is constantly provided for many mechanical oscillation nodes. The present invention overcomes these problems completely.

The invention has thus been shown and described with reference to the specific embodiments. However, it should be noted that the present invention is in no way limited to the details of the illustrated structures but changes and modifications may be made within the scope of the appended claims.

We claim:

1. A piezoelectric transformer comprising:
a piezoelectric plate in the form of an elongated plate and electrodes formed thereon,
the piezoelectric plate being divided into a pair of driver sections and at least one generator section which are continuous and integral with each other so as to form a single piezoelectric plate,
the pair of driver sections being formed of two end regions of the piezoelectric plate containing a mechanical resonance node in an oscillation mode of the three or more odd number times of ½ of a resonance wavelength λ of the longitudinal mechanical oscillation in length of the piezoelectric plate,
the at least one generator section being formed of a central region of the piezoelectric plate containing a mechanical resonance node in the above mentioned oscillation mode,
the driver sections being polarized in a thickness direction, and
the driver sections having a distance of λ/2 from the corresponding end of the piezoelectric plate.

2. A piezoelectric transformer as claimed in claim 1 where the at least one generator section has a length of λ/2 and includes two subsections of the same length which are polarized in a longitudinal direction but in a direction opposite to each other.

3. A piezoelectric transformer as claimed in claim 1 where the at least one generator section is divided into three or more odd number of regions at every distance of λ/2, a center region of the three of more odd number of regions being also divided into two central regions at a distance of λ/4, the two central regions and three or more odd number of regions excluding the three or more odd number of regions being polarized in a longitudinal direction in such a manner that the polarization of each pair of adjacent regions is opposite to each other.

4. A piezoelectric transformer as claimed in claim 1 wherein the driver sections are polarized in the thickness direction but in a direction opposite to each other.

5. A piezoelectric transformer as claimed in claim 1 wherein the driver sections being polarized in the same thickness direction.

6. A piezoelectric transformer as claimed in claim 1 wherein supports which also function as an electric terminal are formed at the nodes of the mechanical resonance of the longitudinal oscillation in length of the piezoelectric plate in both the driver sections and the at least one generator section.

7. A method for driving the piezoelectric transformer as claimed in claim 5 wherein the driver sections are applied with a driving potential of the same phase, so that an output voltage is obtained from the at least one generator electrode.

8. A method for driving the piezoelectric transformer as claimed in claim 1 wherein the driver sections are applied with a driving potential of opposite phase, so that an output voltage is obtained from the at least one generator electrode.

* * * * *

UNITED STATES PATENT AND TRADEMARK OFFICE
CERTIFICATE OF CORRECTION

PATENT NO. : 5,365,141
DATED : November 15, 1994
INVENTOR(S) : Jun KAWAI et al

It is certified that error appears in the above-indentified patent and that said Letters Patent is hereby corrected as shown below:

On the title page, insert item

— [30]   Foreign Application Priority Data

Feb. 14, 1992 [JP]   Japan .......................... 4-027040 —.

Signed and Sealed this

Tenth Day of January, 1995

Attest:

BRUCE LEHMAN

Attesting Officer   Commissioner of Patents and Trademarks